(12) United States Patent
Slowko (10) Patent No.: US 7,531,812 B2
(45) Date of Patent: May 12, 2009

(54) METHOD AND SYSTEM FOR THE DIRECTIONAL DETECTION OF ELECTRONS IN A SCANNING ELECTRON MICROSCOPE

(75) Inventor: Witold Slowko, Wroclaw (PL)

(73) Assignee: Politechnika Wroclawska, Wroclaw (PL)

( * ) Notice: Subject to any disclaimer, the term of this patent is extended or adjusted under 35 U.S.C. 154(b) by 161 days.

(21) Appl. No.: 11/410,208

(22) Filed: Apr. 25, 2006

(65) Prior Publication Data

US 2006/0249686 A1 Nov. 9, 2006

Related U.S. Application Data

(63) Continuation-in-part of application No. PCT/PL2004/000079, filed on Oct. 6, 2004, and a continuation-in-part of application No. PCT/PL2004/000080, filed on Oct. 6, 2004.

(30) Foreign Application Priority Data

Oct. 27, 2003  (PL) ........................... 363131
Jan. 21, 2004  (PL) ........................... 364510

(51) Int. Cl.
   *H01J 37/244* (2006.01)
(52) U.S. Cl. ............ 250/397; 250/307; 250/310; 250/311; 313/103 CM; 313/105 CM
(58) Field of Classification Search ........... 250/397, 250/307, 310, 311; 313/103 CM, 105 CM
See application file for complete search history.

(56) References Cited

U.S. PATENT DOCUMENTS

| 4,588,890 | A | * | 5/1986 | Finnes ................. | 250/307 |
| 4,868,394 | A | * | 9/1989 | Fukuhara et al. ......... | 250/397 |
| 4,958,079 | A | * | 9/1990 | Gray ................... | 250/397 |
| 5,387,793 | A | * | 2/1995 | Sato et al. ............. | 250/310 |
| 5,990,483 | A | * | 11/1999 | Shariv et al. ........... | 250/397 |
| 6,590,210 | B1 | * | 7/2003 | Essers .................. | 250/310 |
| 2002/0125428 | A1 | * | 9/2002 | Krans .................. | 250/311 |
| 2006/0027748 | A1 | | 2/2006 | Slowko | |
| 2007/0023659 | A1 | * | 2/2007 | Sergeevich et al. ....... | 250/311 |

FOREIGN PATENT DOCUMENTS

| JP | 62184752 | 8/1987 |
| JP | 2275368 | 11/1990 |
| PL | 180420 | 4/1998 |
| PL | 316499 | 4/1998 |
| PL | 329339 | 4/2000 |
| WO | PCT/IB/326 | 5/2006 |
| WO | PCT/IB/373 | 5/2006 |
| WO | PCT/ISA/237 | 5/2006 |

* cited by examiner

*Primary Examiner*—Jack I Berman
*Assistant Examiner*—Michael Maskell
(74) *Attorney, Agent, or Firm*—Walter Ottesen (57) ABSTRACT

A system detects electrons according to their emission direction in a scanning electron microscope. The system includes a scintillator electron detector and a set of electrodes focusing and controlling the electron flow. At least in two sectors of the electron flow from the sample stage (7) to the scintillator (3), sector flow control electrodes (9) are placed and supplied alternatively with electric pulses. The sector flow control electrodes (9) may be made of a metal grid or in a shape of conducting plates or deposited on the surface of a microporous plate in the form of a thin conductive layer.

16 Claims, 4 Drawing Sheets

METHOD AND SYSTEM FOR THE DIRECTIONAL DETECTION OF ELECTRONS IN A SCANNING ELECTRON MICROSCOPE

CROSS REFERENCE TO RELATED APPLICATIONS

This is a continuation-in-part application of international patent application PCT/PL 2004/000079, filed Oct. 6, 2004, claiming priority from Polish application 363131, filed Oct. 27, 2003, and a continuation-in-part application of international patent application PCT/PL 2004/000080, filed Oct. 6, 2004, and claiming priority from Polish application 364510, filed Jan. 21, 2004, and the entire content of all applications is incorporated herein by reference.

FIELD OF THE INVENTION

The invention relates to a system for the directional detection of electrons in a scanning electron microscope, particularly destined to obtain topographic contrast of images of a sample surface or to enable its three dimensional reconstruction. Some embodiments of the system are destined particularly for the work at pressures in the order of 100 Pa in the sample chamber.

BACKGROUND OF THE INVENTION

-- There are systems for the directional detection of electrons known from the publication: W. Slówko, "Directional detection of secondary electrons for electron beam profilography", Vacuum 52 (1999), page 441, and Polish patent descriptions: no. 1766333 entitled "Secondary electron detection unit", no. 180420 entitled "System for signal processing in a scanning electron microscope", no. P316499 entitled "Method of surface topography reconstruction in a scanning electron microscope", and P363131 entitled "Electron detection system for a scanning electron microscope". They consist of a symmetrical disposition of two or more electron detectors above the examined sample surface. Each of the detectors should collect electrons coming from another sector of the solid angle of the electron emission. That means that the electron detection occurs simultaneously in all the angle sectors. Signals obtained from particular detectors depend on the emission currents in the matching angle sectors and may be used for determining the local slope angles of the surface examined and for its three dimensional reconstruction. - -

-- There are solutions of electron detection systems known from the patent applications: no. P329339, entitled "High pressure scanning electron microscope", and United States patent application publication US 2006/0027748 A1, entitled "Secondary electron detector system for a scanning electron microscope", which are composed of a microporous plate, advantageously of the microsphere type, and a secondary electron detector of the scintillation type. In both solutions, the stream of secondary electrons, irrespectively of their emission directions, is brought into a hole in the lower wall of an intermediate chamber which is biased with a proper voltage. So the signal does depend substantially on the directions of the secondary electron emission that are detected. --

Then, the detection systems based on the known method of the directional electron detection are composed of two or more electron detectors disposed symmetrically around the axis of the electron beam scanning the examined sample surface, and a set of electrodes biased properly with constant voltages which should ensure a laminar flow of emitted electrons according to the directions of their emission. In case of the detection of backscattered electrons, the detector system may be relatively simple and composed of two or four semiconductor diodes of the p-i-n type connected with proper amplifiers for their signals. However, the detector system for secondary electrons is much more complex. It must contain two or four complete scintillator detectors of the Everhart-Thornley type, that is, a scintillator with its high voltage supply, a light pipe, a photomultiplier with its voltage supply and a signal amplifier for each of the two or four detector channels.

SUMMARY OF THE INVENTION

The substance of the method according to a first aspect of the invention comprises that at least two sectors for the flow of electrons to be detected are arranged in the detector system and the flow of electrons in the particular sectors is opened and closed alternatively in a proper sequence.

The substance of the system according to a second aspect of the invention comprises that in at least in two sectors of the electron flow from the sample to a scintillator sector flow control electrodes are placed and supplied alternatively with electric pulses. The sector flow control electrodes can be made of a metal grid and placed in the way of the electron flow from the sample stage to the scintillator.

The sector flow control electrodes can alternatively be made of metal plates and properly placed in order not to block off the electron flow to the scintillator.

The sector flow control electrodes can also be deposited on the microporous plate in the form of thin conductive layers. The system can contain one scintillator or at least two scintillators connected with one single photomultiplier by means of a single light pipe or light conductor or by means of two light pipes or light conductors at least.

The subject of the invention according to a third aspect of the invention is an electron detection system for a scanning electron microscope equipped with a lower throttling aperture, a microporous plate with a screen pipe and scintillators connected with light pipes and photomultipliers. The substance of the invention according to this third aspect of the invention comprises that at least two scintillators are placed at the output side of the microporous plate.

It is advantageous when each scintillator is positively biased against the output of the microporous plate with a high voltage of the value over 1000V.

It is also advantageous when the screen pipe placed in the hole of the microporous plate is negatively biased against the lower throttling aperture.

The main advantage of the electron detector system according to the invention is the possibility of the directional detection of secondary electrons in order to obtain output signals that are dependent on a local azimuth and slope angle of the surface examined. The output signals may be processed to obtain a three-dimensional reconstruction of the sample surface.

BRIEF DESCRIPTION OF THE DRAWINGS

The invention will now be described with reference to the drawings wherein:

FIG. 1a is a vertical section view of a system for a directional detection of electrons in a scanning electron microscope according to a first embodiment of the invention;

FIG. 1b shows sector flow control electrodes seen from above in the embodiment of FIG. 1a;

FIG. 1c shows sequential voltage waveforms on the sector flow control electrodes in the embodiment of FIG. 1a;

FIG. 2a is a vertical section view of a system for the directional detection of electrons in a scanning electron microscope according to a second embodiment of the invention;

FIG. 2b shows sector flow control electrodes seen from above in the embodiment of FIG. 2a;

FIG. 2c shows sequential voltage waveforms on the sector flow control electrodes in the embodiment of FIG. 2a;

FIG. 3a is a vertical section view of the system for the directional detection of electrons in a scanning electron microscope according to a third embodiment of the invention;

FIG. 3b shows the embodiment of FIG. 3a in cross section;

FIG. 3c shows sector flow control electrodes seen from above in the embodiment of FIG. 3a;

FIG. 3d shows sequential voltage waveforms on the sector flow control electrodes; and, FIG. 4 shows a system for the directional detection of electrons in a scanning electron microscope according to a fourth embodiment of the invention in a cross section.

DESCRIPTION OF THE PREFERRED EMBODIMENTS OF THE INVENTION

The first embodiment of the invention will now be described with reference to FIGS. 1a to 1c.

Figure 1:
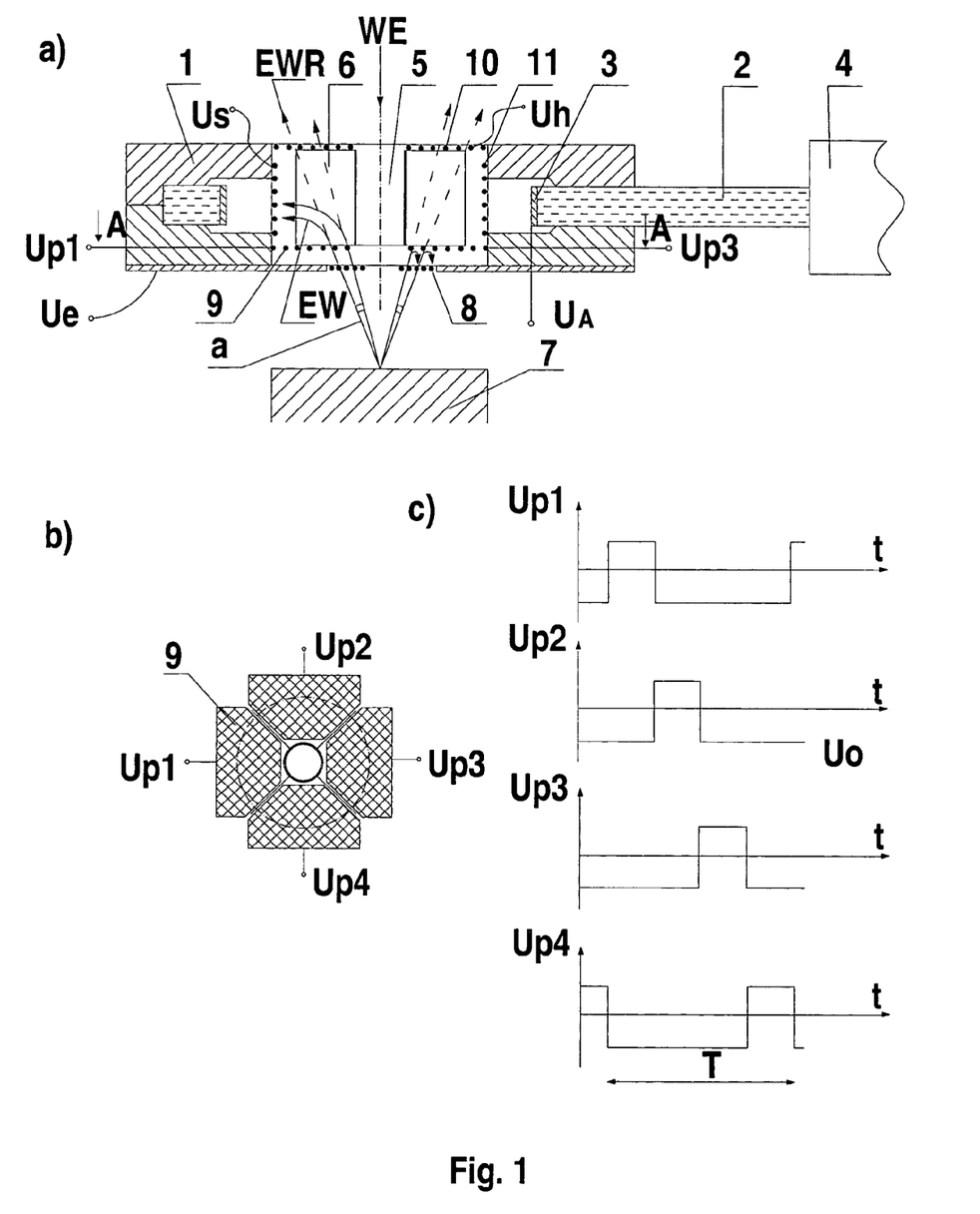

The system for a directional detection of electrons in a scanning electron microscope shown in FIG. 1a is mounted in a ring-shaped head body 1 made of teflon. A light conductor or light pipe 2 is located in a slot of the two-piece head body 1 and is in the form of a plexiglass plate with an opening covered with a scintillator 3 on its perimeter. The light pipe 2 is connected to a photomultiplier 4. Inside the head body 1, a screen pipe 5 is located with four screen plates 6 attached symmetrically which divide a hole in the head body 1 into four sectors. In a lower part of the head body 1, on a side of the head body facing toward a sample stage 7, an input grid 8 is located. Above the input grid 8, four sector electron flow control electrodes 9 are located and each one is placed in one sector formed between the screen plates 6. The sector flow control electrodes 9 each are made of a metal grid. A retarding grid 10 is provided in an upper part of the head body directed away from the sample stage 7. The retarding grid 10 screens the hole in the head body 1 while a further screen grid 11 shields the slot on the hole perimeter.

The operation of the system for the directional detection of electrons in a scanning electron microscope described above is as follows.

Electron bombardment by a primary electron beam WE causes an emission of secondary electrons EW and of backscattered electrons EWR from the surface of the examined object placed on the sample stage 7. The emitted electrons EW and backscattered electrons EWR follow their initial emission directions and a fraction thereof, within the vertical detection angle a, enter the detection system input window through the input grid 8. The value of this angle can be adjusted by an extraction voltage Ue applied to the input grid 8. The input window is ring-shaped because its central part is shadowed by the screen pipe 5, protecting the primary electron beam WE from the electric field in the detector. The detection system interior is divided into four sectors by the four screen plates 6, in which the electron flow is controlled by the four sector flow control electrodes 9. The sector flow control electrodes 9 are biased with a constant negative voltage Uo of approximately −100V, which prevents secondary electrons EW of energies lower than 100eV from entering the detection system. The retarding grid 10, located at the system outlet, is biased with a retarding voltage Uh=−50V which causes the backscattered electrons EWR with higher energies than the potential of the lower sector flow control electrode 9 voltage Uo to leave the system without detection. The electron stream in each sector is shielded from the scintillator 3 biased with a high positive voltage Ua=10 kV by the screen grid 11 biased with a grid voltage Us. To sample the emission current in the first sector of the input window, a positive voltage pulse Up1, having an amplitude slightly higher than the bias voltage Uo, is applied to the corresponding sector flow control electrode 9. In such case, all electrons emitted toward this sector will enter the detection system, however, only secondary electrons EW with energies below or close to 50 eV determined by the retarding grid 10 voltage will flow to the scintillator 3. The secondary electron EW signal is converted by the scintillator 3 to its light equivalent and thereafter is transferred through the light pipe 2 to the photomultiplier 4. At the photomultiplier 4, the signal is converted into its electrical form and amplified. After approximately one fourth of a sample period, the first pulse Up1 fades and the electron flow in this sector is stopped. Simultaneously, the next voltage pulse Up2 is applied to the second sector flow control electrode 9. The secondary electron EW detection process in this sector is initiated. The consecutive secondary electron EW detection phases follow in the next sectors in a given time sequence. The signals from the four detection channels are fed to a proper computer acquisition system which sequentially samples and separates the signals. The described example of the detection system is destined for secondary electron EW detection because the arrangement of the metal grids and the electrical potential applied thereto as described above does not stop backscattered electrons EWR which therefore are not detected.

The second embodiment of the invention will now be described with reference to FIGS. 2a to 2c.

Figure 2:
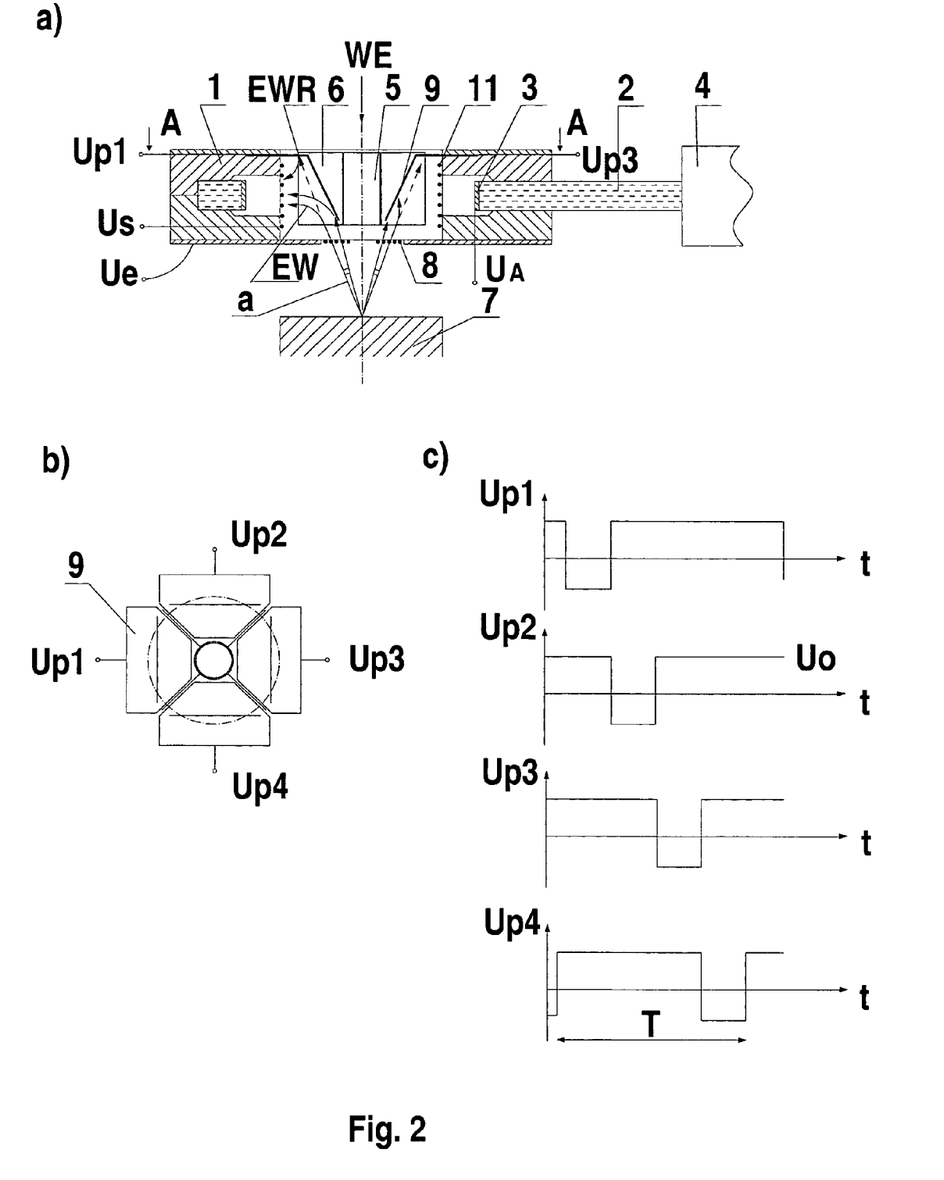

The system for the directional detection of electrons in a scanning electron microscope shown in FIG. 2a is designed similarly to the first embodiment and is mounted in a ring-shaped head body 1 made of teflon. A light conductor or light pipe 2 is located in a slot of the two-piece head body 1 and is in the form of a plexiglass plate with a hole covered with a scintillator 3 on its perimeter. The light pipe 2 is connected to a photomultiplier 4. A screen pipe 5 with four screen plates 6 divides the hole in the head body 1 interior into four sectors. An input grid 8 is located in a lower part of the head body 1 on a side of the head body facing toward a sample stage 7. Electron flow control electrodes 9 are located above the input grid 8 in the upper part of the head body 1 with each one of the electron flow control electrodes being placed in one sector formed between the screen plates 6. The sector flow control electrodes 9 are made of sheet metal plates with their ends bent towards the input grid 8. The slot in the head body 1 is shielded by a screen grid 11.

This version of the system is destined for the directional detection of backscattered electrons EWR only, or for both backscattered electrons EWR and secondary electrons EW.

The operation of the system for the directional detection of electrons in a scanning electron microscope described above is as follows.

Electron bombardment by a primary electron beam WE causes emission of secondary electrons EW and backscattered electrons EWR from the examined object on the sample stage 7. The emitted electrons EW and EWR follow their initial direction of emission and a fraction thereof, within the vertical detection angle a, enters the detection unit input window through the input grid 8. The value of this angle can be adjusted with the extracting voltage Ue applied to the input grid 8. When Ue<−50V, only backscattered electrons EWR with energies higher than 50 eV enter the detection unit while electrons of all energy fractions may pass through the grid when Ue=0. The input window is ring-shaped because its central part is occupied by the screen pipe 5 that protects the primary electron beam WE from the electric field inside the detector. The detection system interior is divided into four sectors by the four screen plates 6 in which the electron flow is controlled by the four sector flow control electrodes 9. The sector flow control electrodes 9, shown in FIG. 2b, are biased with a constant positive voltage Uo of approximately +100V. In such case, both backscattered electrons EWR and secondary electrons EW reach the surface of the sector flow control electrodes 9 and are collected by them. In this case, secondary electrons EW of the second type generated by the backscattered electrons EWR and secondary electrons EW collected by the sector flow control electrodes 9 cannot flow towards the scintillator 3 because the grid voltage Us of the screen grid 11 is lower than the voltage of the sector flow control electrodes 9. To sample the emission current at the first sector of the input window, a negative voltage impulse Up1, with an amplitude slightly higher than the bias voltage Uo, is applied to the corresponding sector flow control electrode 9. In this case, secondary electrons EW of any type, either coming from the sample or emitted from the sector flow control electrode 9, can reach the scintillator 3 because the voltage Us applied to the screen grid 11 exceeds the voltage applied to the sector flow control electrode 9. The signal multiplexing procedure proceeds as described in the first embodiment. Secondary emission from the sector flow control electrodes 9 fulfils a crucial role in the control of the electron flow to the scintillator 3, therefore, the sector flow control electrodes 9 should be made of, or be coated with a material of a high secondary emission coefficient, such as MgO.

The third embodiment of the invention will now be described with reference to FIGS. 3a to 3d.

Figure 3:
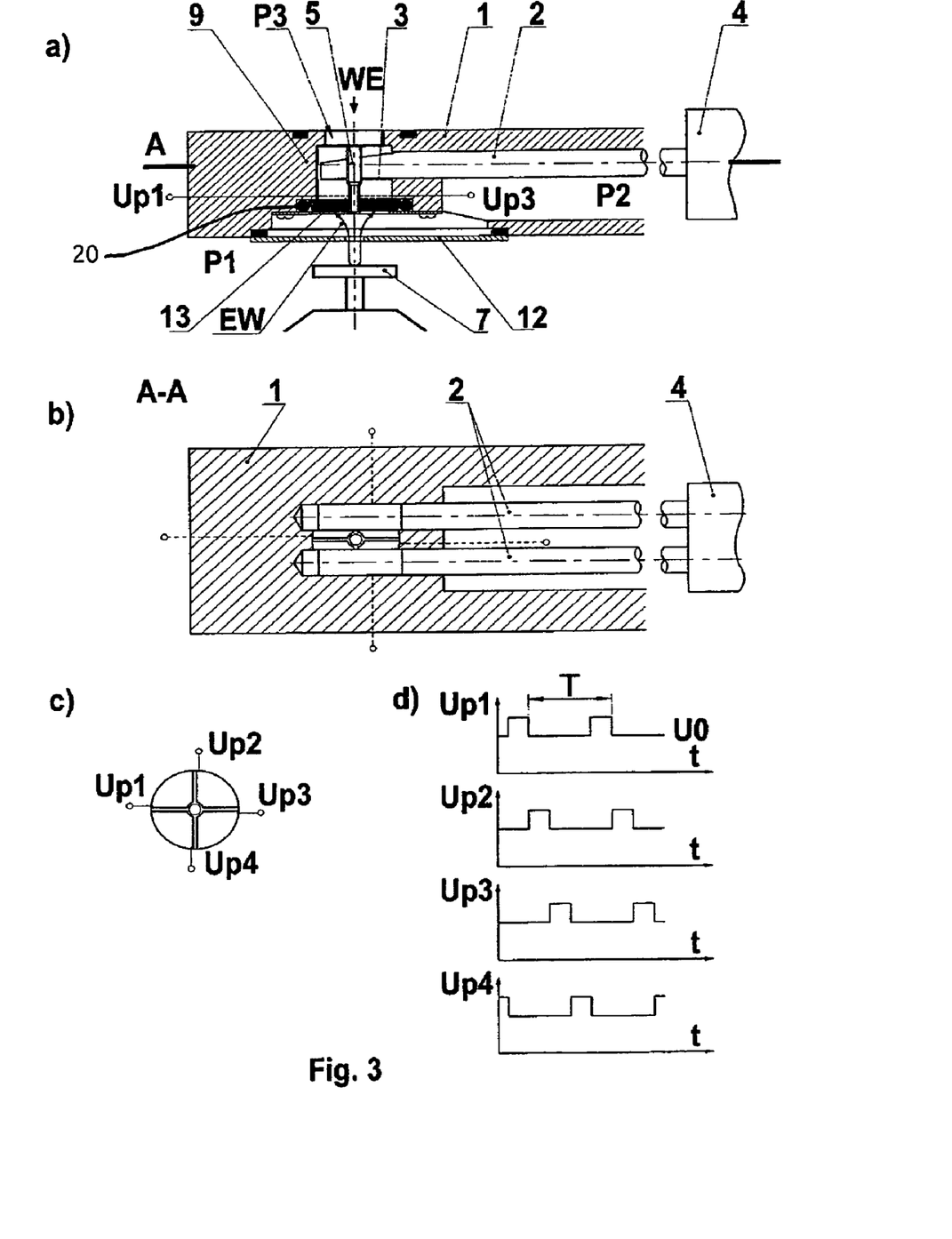

-- The system for the directional detection of electrons in a scanning electron microscope shown in FIG. 3a is adapted to operate in a low vacuum scanning electron microscope. The unit is mounted in a head body 1, made of teflon. A lower throttling aperture 12 is located in the lower part of the head body 1 facing toward a sample stage 7 and formed as a metal plate with a small hole. The hole is coaxial with the axis of the primary electron beam WE. A microporous plate 13 is located above the lower throttling aperture 12. An O-ring seal 20 is interposed between head body 1 and the microporous plate 13. The microporous plate 13 has a hole also coaxial with the axis of the primary electron beam WE. Inside the microporous plate 13, a screening pipe 5 is fixed by means of a teflon seal. A lower entrance surface of the microporous plate 13 which faces toward the sample stage is coated with a thin conducting layer, permeable for electrons. A similar thin conducting layer is also present on the upper surface of the microporous plate 13 directed away from the sample stage. The conductive layer on the upper surface of the microporous plate 13 is however divided into four independent sectors, which play the role of the sector flow control electrodes 9. Two scintillators 3 are located above the microporous plate 13 and connected with a common photomultiplier 4 by means of two light pipes 2. --

The operation of the system for the directional detection of electrons in a scanning electron microscope described above is as follows.

-- Secondary electrons EW, generated from the specimen on the sample stage 7, are attracted by the lower throttling aperture 12 biased with a positive voltage, and pass through the hole in this electrode. The secondary electrons EW encounter the retarding electric field on the other side of the lower throttling aperture 12, which is caused by the screen pipe 5 biased negatively in relation to the lower throttling aperture 12. This forms a diverging electron lens in the region of the hole in the lower throttling aperture 12 and makes the secondary electron EW flow from the sample stage 7 to the microporous plate 13 approximately laminar. Thus, the emission direction of the secondary electrons EW implies the input sector of the microporous plate 13 they can reach. On the other side of the microporous plate 13, the conducting layer is divided into four independent sectors, which constitute the sector flow control electrodes 9 powered with constant voltage Uo and sequential voltage pulses Up1, Up2, Up3, Up4 shown in FIG. 3d. The secondary electrons EW are multiplied by secondary emission from the walls while passing through the microchannels in the microporous plate 13 biased with a voltage of an order of 1 kV. The amplification of the secondary electron signal by the microporous plate 13 in a given sector depends exponentially from the supply voltage. Therefore, a 20% increase in the bias voltage Uo, achieved by adding the sampling pulse Up1, Up2, Up3, or Up4 to the sector flow control electrodes 9, is enough to make the output current in a given sector ten times higher than in the others. The amplified secondary electron EW current leaves the microporous plate 13 in the sampled sector and reaches one of the two scintillators 3, placed symmetrically at both sides of the primary electron beam WE, and biased positively in relation to the microporous plate 13 with the accelerating voltage of approximately 10 kv. The scintillators 3 convert the input electric current into a light equivalent. This light signal is transported through the light pipes 2 to the common photomultiplier 4 where it is converted into the output electric signal. In the embodiment described, two light pipes 2 each having a rod form with a circular cross section connected with two scintillators 3 are used, instead of one flat light pipe 2 with an annular scintillator 3. This is due to the fact, that in a low-vacuum scanning electron microscope, it is easier to seal the light pipes 2 having a rod form within the head body 1 which separates zones of different pressures P1, P2 and P3. --

The fourth embodiment of the invention will now be described with reference to FIG. 4.

Figure 4:
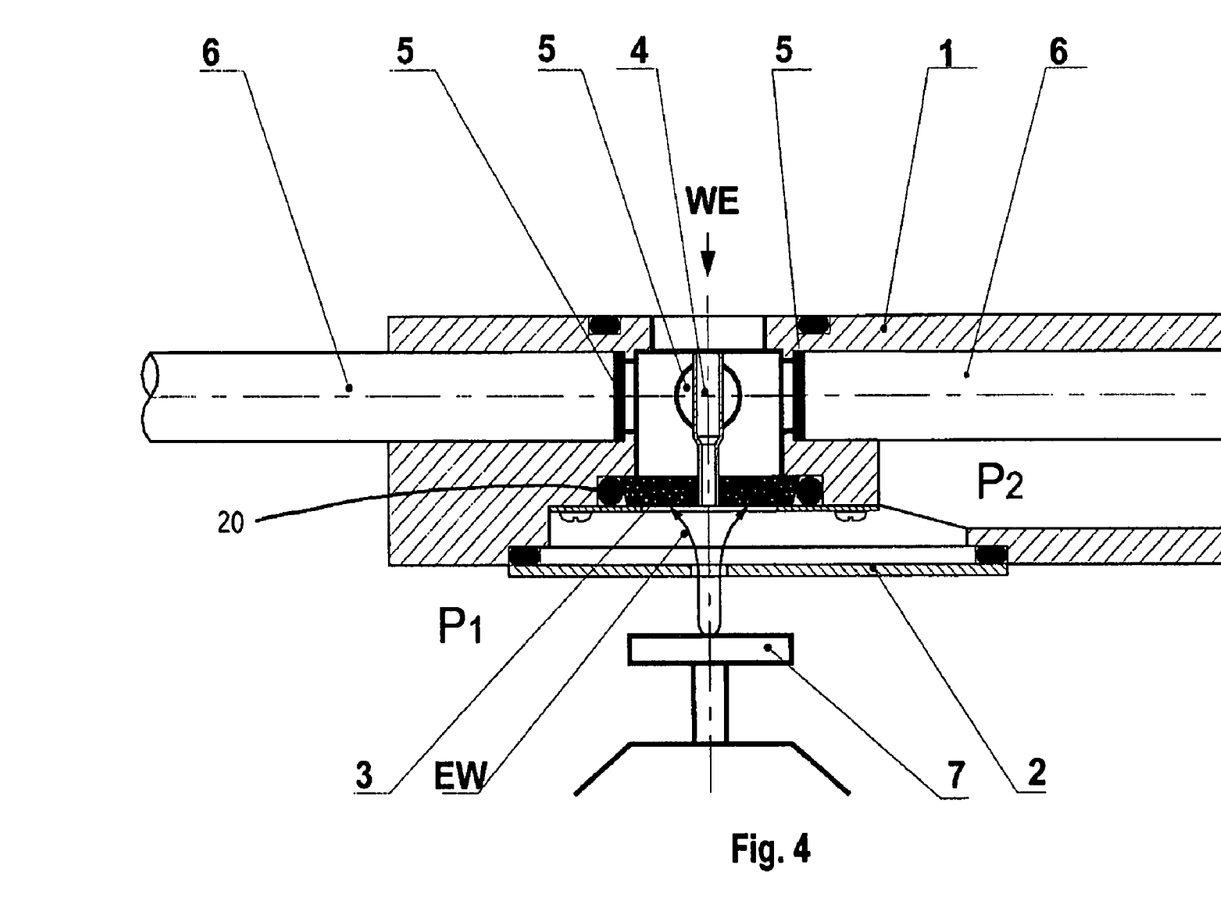

The system for the directional detection of electrons in a scanning electron microscope shown in FIG. 4 is also adapted to operate in a low-vacuum scanning electron microscope. The system is mounted in a head body 1 made of teflon. In the lower part of the head body 1, a lower throttling aperture in the form of the metal plate 2 with a small hole is placed at the axis of the primary electron beam WE. Above the lower throttling aperture 2, a microporous plate 3 is located. The microporous plate 3 has a hole at the axis of the primary electron beam WE, in which a screen pipe 4 is fastened by means of a teflon sealing. In the direction of the primary electron beam upstream of the microporous plate 3, four scintillators 5 are disposed symmetrically around the axis of the primary electron beam WE. The scintillators 5 are connected with light conductors or light pipes 6 that lead to photomultipliers (not shown).

The electron detection system for a scanning electron microscope arranged in the described way operates as follows.

Secondary electrons EW generated from a sample positioned on the sample stage 7 are attracted by the lower throttling aperture 2 biased positively and pass through the hole in the electrode. At the other side of the lower throttling aperture 2, the stream of the secondary electrons EW encounter an electric retarding field created by the screen pipe 4 negatively biased with respect to the lower throttling aperture 2. As a result, in the lower throttling aperture 2 region, a diverging electron lens arises and the flow of the secondary electrons EW from the sample stage 7 to the microporous plate 3 is laminar. Then, the secondary electrons EW impinge on a sector of the microporous plate 3 adequately to their direction of emission. The secondary electrons EW pass through microscopic channels in the microporous plate 3 of the microsphere kind supplied with a voltage of order 1 kV, and they are multiplied because of secondary emission from its walls. The multiplied stream of secondary electrons EW escapes the microporous plate 3 at the output side where four scintillators 5 are disposed symmetrically around the axis of the electron beam WE. The scintillators 5 are positively biased with respect to the microporous plate 3 with a voltage about 12 kV. Accordingly, they trap secondary electrons EW that escape adjacent sectors of the microporous plate 3, respectively. There, the electron signals are converted into light signals transmitted through the light pipes 6 to corresponding photomultipliers where they are finally converted into output signals. The amplitudes of the signals in each of the four channels depend on the number of secondary electrons EW emitted toward the sector corresponding to a particular scintillator 5. Therefore, the detection system has directional properties. The properties may be disturbed by a scattering of secondary electrons EW which are scattered in collision with gas molecules that fill the sample chamber to a relatively high pressure $P_1$. The gas pressure $P_2$ in the space between the microporous plate 3 and the lower throttling aperture 2 that constitutes an intermediate chamber is two orders of magnitude less and does not cause serious scattering of secondary electrons EW. In order to minimize the effects of the electron scattering, a distance of the sample stage 7 from the lower throttling aperture 2 should be comparable to a diameter of the lower throttling aperture 2.

The four signals obtained from the electron detection system for a scanning electron microscope can be processed in the way that leads to the synthesis of the three dimensional image.

It is understood that the foregoing description is that of the preferred embodiments of the invention and that various changes and modifications may be made thereto without departing from the spirit and scope of the invention as defined in the appended claims.

What is claimed is:

1. An electron detection system for a scanning electron microscope providing a primary electron beam and defining a beam axis, said electron detection system comprising:
    a head body having an upper portion and a lower portion;
    a lower throttling aperture disposed at said lower portion of said head body
    said lower throttling aperture separating spaces of different gas pressures and having a hole defining a passage for said primary electron beam;
    a microporous plate having a hole and being arranged in said head body:
    said microporous plate separating spaces of different gas pressure and said microporous plate having a first side directed to said lower throttling aperture and a second side opposite said first side;
    a screen pipe arranged in said hole of said microporous plate;
    a seal for fixing and sealing said screen pipe in said hole of said microporous elate;
    said hole of said lower throttling aperture and said screen pipe being arranged along a straight axis;
    at least a first scintillator arranged on said second side of said microporous plate connected with a first light pipe and a first photomultiplier; and,
    at least a second scintillator arranged on said second side of said microporous plate connected with a second light pipe and a second photomultiplier.

2. The electron detection system of claim 1, said first and said second scintillators being arranged symmetrically with respect to said straight axis.

3. The electron detection system of claim 2, wherein said first and said second scintillators are positively biased against said second side of said microporous plate with high voltage of the value over 1000V.

4. The electron detection system of claim 2, wherein said screen pipe placed in the hole of said microporous plate is negatively biased against said lower throttling aperture whereby a diverging electron lens is formed.

5. The electron detection system of claim 1, further comprising a third scintillator arranged on said second side of said microporous plate connected with a third light pipe and a third photomultiplier; a fourth scintillator arranged on said second side of said microporous plate connected with a fourth light pipe and a fourth photomultiplier; and, said first, second, third and fourth scintillators being arranged symmetrically with respect to said straight axis to obtain four sectors of directional detection of electrons.

6. A method for detecting electrons according to their emission direction in a scanning electron microscope having a beam axis, the method comprising the steps of:
    providing an electron detector having an input window arranged symmetrically with respect to said beam axis and at least a first and a second control electrode arranged symmetrically with respect to said beam axis; said first and second control electrodes defining a first and a second sector of an electron flow from a sample to the detector, respectively;
    applying a retarding electrical potential or attracting electrical potential to each of said control electrodes in said first and second sectors of said electron flow in an alternating manner, wherein electric fields caused by said electrical potential cause or prevent a passage of said electrons emitted in a particular section of a solid angle and entering said input window; and,
    detecting electrons with said electron detector while said electrical potential is applied to one of said first and second control electrodes.

7. A detection system for detecting electrons according to their emission direction in a scanning electron microscope, which scanning electron microscope defines a beam axis along which a primary electron beam is passed to a specimen under investigation, the detection system comprising:
    an innut window arranaed symmetrically with respect to said beam axis:
    an electron detector;
    at least a first and a second control electrode symmetrically arranged around said beam axis;
    a voltage supply for alternatively supplying a control voltage to one of said first and second control electrodes;
    said first and second control electrodes being arranged with respect to said beam axis and said detector in a manner that electrons emitted from the specimen under investigation in a first solid angle and entering said input window are prevented from reaching said electron detector by said control voltage while electrons emitted from the specimen under investigation in a second solid angle and entering said input window are not prevented from reaching said electron detector.

8. The detection system of claim 7, wherein said first and said second control electrodes are made of a metal grid.

9. The detection system of claim 7, wherein said first and said second electrodes are made of metal plates and properly placed in order not to blank off an electron flow to said detector.

10. The detection system of claim 7, further comprising a microporous plate; and, said first and said second control electrodes being deposited on said microporous plate in the form of thin conductive layers.

11. The detection system of claim 7, wherein said detector comprises at least one scintillator.

12. The detection system of claim 8, wherein said detector comprises at least one scintillator; and, said first and said second control electrodes are placed in a way of an electron flow from a sample stage to said scintillator.

13. The detection system of claim 7, further comprising at least a first scintillator and a second scintillator; a single light pipe and a single photomultiplier; and, said first scintillator and said second scintillator being connected to said single photomultiplier by said single light pipe.

14. The detection system of claim 11, further comprising at least a first scintillator and a second scintillator; a first and a second light pipe and a single photomultiplier; and, said first scintillator being connected to said single photomultiplier by said first light pipe and said second scintillator being connected to said single photomultiplier by said second light pipe.

15. The detection system of claim 7, further comprising:
a head body having an upper portion and a lower portion;
a lower throttling aperture disposed at said lower portion of said head body;
said lower throttling aperture separating spaces of different gas pressures and having a hole defining a passage for said primary electron beam;
a microporous plate arranged in said head body and having a hole;
said microporous plate separating spaces of different gas pressure;
said microporous plate having a first side directed toward said lower throttling aperture and a second side opposite said first side;
a screen pipe;
a seal for fixing and sealing said screen pipe in said hole of said microporous plate; and,
said first and second control electrodes being deposited on said microporous plate in the form of thin conductive layers.

16. The electron detection system of claim 1, further comprising a seal sealing said microporous plate within said head body.

* * * * *

UNITED STATES PATENT AND TRADEMARK OFFICE
CERTIFICATE OF CORRECTION

PATENT NO. : 7,531,812 B2
APPLICATION NO. : 11/410208
DATED : May 12, 2009
INVENTOR(S) : Witold Slowko

It is certified that error appears in the above-identified patent and that said Letters Patent is hereby corrected as shown below:

Column 7:
Line 65: delete "elate" and substitute -- plate -- therefor.

Column 8:
Line 52: delete "innut" and substitute -- input -- therefor.
Line 52: delete "arranaed" and substitute -- arranged -- therefor.
Line 53: delete "axis:" and substitute -- axis; -- therefor.

Signed and Sealed this

Eleventh Day of August, 2009

David J. Kappos
*Director of the United States Patent and Trademark Office*